(12) United States Patent
Hayashi et al.

(10) Patent No.: US 7,750,659 B2
(45) Date of Patent: Jul. 6, 2010

(54) VOLTAGE DETECTING CIRCUIT AND SEMICONDUCTOR DEVICE INCLUDING THE SAME

(75) Inventors: Koichiro Hayashi, Tokyo (JP); Hitoshi Tanaka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 60 days.

(21) Appl. No.: 12/259,923

(22) Filed: Oct. 28, 2008

(65) Prior Publication Data
US 2009/0115402 A1 May 7, 2009

(30) Foreign Application Priority Data
Oct. 29, 2007 (JP) ............................. 2007-280506

(51) Int. Cl.
*G01R 31/02* (2006.01)
*G01R 31/26* (2006.01)
(52) U.S. Cl. ........................ 324/763; 324/769
(58) Field of Classification Search ......... 324/763–765, 324/768–769; 327/419–437
See application file for complete search history.

(56) References Cited

U.S. PATENT DOCUMENTS

| 4,800,339 | A | * | 1/1989 | Tanimoto et al. ............ 330/253 |
| 5,438,990 | A | * | 8/1995 | Wahlstrand et al. ......... 324/260 |
| 5,583,820 | A | * | 12/1996 | Padoan et al. ................ 365/226 |
| 5,654,655 | A | * | 8/1997 | Awaji et al. .................. 327/108 |
| 5,801,533 | A | * | 9/1998 | Kalb, Jr. ...................... 324/252 |
| 6,049,447 | A | * | 4/2000 | Roesch et al. ................. 361/58 |
| 6,542,409 | B2 | * | 4/2003 | Yamada ................... 365/185.2 |
| 6,549,029 | B1 | * | 4/2003 | Hsieh et al. .................. 324/769 |
| 6,791,350 | B2 | * | 9/2004 | Taguchi ..................... 324/770 |
| 6,806,726 | B2 | * | 10/2004 | Okada et al. ................. 324/765 |
| 6,842,027 | B2 | * | 1/2005 | Liu et al. ..................... 324/763 |

FOREIGN PATENT DOCUMENTS

| JP | 10-134574 A | 5/1998 |
| JP | 2000-14134 A | 1/2000 |
| JP | 2001-67132 A | 3/2001 |

\* cited by examiner

*Primary Examiner*—Ha Tran T Nguyen
*Assistant Examiner*—Joshua Benitez
(74) *Attorney, Agent, or Firm*—Sughrue Mion, PLLC

(57) ABSTRACT

A voltage detecting circuit detects a voltage between first and second wirings, and comprises at least first and second transistors connected in series between the first and second wirings, wherein a first reference voltage is supplied to a gate of the first transistor, a gate and a drain of the second transistor are short-circuited, and a detection signal is output from a connection point between a drain of the first transistor and a source of the second transistor.

10 Claims, 15 Drawing Sheets

VOLTAGE DETECTING CIRCUIT AND SEMICONDUCTOR DEVICE INCLUDING THE SAME

BACKGROUND OF THE INVENTION

1. Field of the Invention

The present invention relates to a voltage detecting circuit, and, more particularly relates to a voltage detecting circuit that detects a variation of an internal voltage generated within a semiconductor device. The present invention also relates to a semiconductor device including the voltage detecting circuit.

2. Description of Related Art

A power source voltage used in a semiconductor device such as a DRAM (Dynamic Random Access Memory) and the like has been reduced year by year, and power consumption has been also reduced accordingly. While a power source voltage has been generally 5 V in the past, it has been reduced thereafter to 3.3 V, and a voltage of about 1.2 V is often used at present.

However, depending on a kind of a semiconductor device, there are internal circuits requiring a higher voltage than the power source voltage. For example, in a DRAM, a selected word line is often set to a higher voltage than the power source voltage. In this case, a boosted internal voltage is necessary in a word-line driving circuit.

However, the internal voltage generated within the semiconductor device has a problem of easily generating a voltage variation as compared with a voltage supplied from the outside. Therefore, to stabilize the internal voltage, a voltage detecting circuit monitoring the internal voltage needs to be used to feed back an output of this circuit to an internal-voltage generating circuit (see Japanese Patent Application Laid-open Nos. H10-134574, 2000-014134, and 2001-067132).

FIG. 13 is a circuit diagram of a voltage detecting circuit 1 according to a related art.

The voltage detecting circuit 1 shown in FIG. 13 detects a variation of an internal voltage VPP boosted within a semiconductor device, and includes three resistors 2 to 4 connected in series between a power source wiring to which a higher potential VPP is supplied and a power source wiring to which a lower potential VSS (usually, a ground potential) is supplied. A detection signal Vdiff is output from a connection point between the resistor 3 and the resistor 4, and is supplied to a comparator 5. The comparator 5 compares a reference voltage Vref and the detection signal Vdiff, and generates a determination signal S based on the comparison. The determination signal S is supplied to an internal-voltage generating circuit (not shown), thereby controlling the boosting operation performed by the internal-voltage generating circuit.

However, the voltage detecting circuit 1 shown in FIG. 13 generates the detection signal Vdiff by resistance-dividing the internal voltage VPP. Therefore, a variation amount appearing in the detection signal Vdiff becomes small even when the internal voltage VPP varies. Specifically, a relationship Vdiff=VPP/3 is established. In this way, the variation amount of the detection signal Vdiff also becomes one third of the variation of the internal voltage VPP. Therefore, sensitivity to a voltage variation is small, and it has been difficult to sufficiently stabilize the internal voltage.

SUMMARY

The present invention seeks to solve one or more of the above problems, or to improve upon those problems at least in part.

In one embodiment, there is provided a voltage detecting circuit detecting a voltage between first and second wirings that includes at least first and second transistors connected in series between the first and second wirings, wherein a first reference voltage is supplied to a gate of the first transistor, a gate and a drain of the second transistor are short-circuited, and a detection signal is output from a connection point between a drain of the first transistor and a source of the second transistor.

In another embodiment, there is provided a semiconductor device that includes the above voltage detecting circuit, an internal-voltage generating circuit generating a potential to be applied to the first or second wiring, and a comparator comparing the detection signal and the second reference voltage, wherein the internal-voltage generating circuit is controlled based on an output of the comparator.

According to the present invention, a voltage between a gate and a source of the first transistor coincides with a voltage between a source and a drain of the second transistor. Therefore, a voltage fall amount of the second transistor is uniquely determined by the voltage between the gate and the source of the first transistor. Consequently, a voltage variation is directly reflected in the detection signal. As a result, the voltage can be monitored with higher sensitivity than the sensitivity according to conventional techniques.

Both the first and second transistors can be N-channel MOS transistors, or can be P-channel MOS transistors. In the former case, it suffices that the source of the first transistor is connected to the lower wiring. On the other hand, in the latter case, it suffices that the source of the first transistor is connected to the higher wiring.

The "source" of a transistor is a node connected to the lower potential in the case of the N-channel MOS transistor, and is a node connected to the higher potential in the case of the P-channel MOS transistor. Similarly, the "drain" of a transistor is a node connected to the higher potential in the case of the N-channel MOS transistor, and is a node connected to the lower potential in the case of the P-channel MOS transistor.

As explained above, according to the present invention, a voltage variation can be detected with higher sensitivity. Therefore, the internal voltage of the semiconductor device can be stabilized with high sensitivity.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
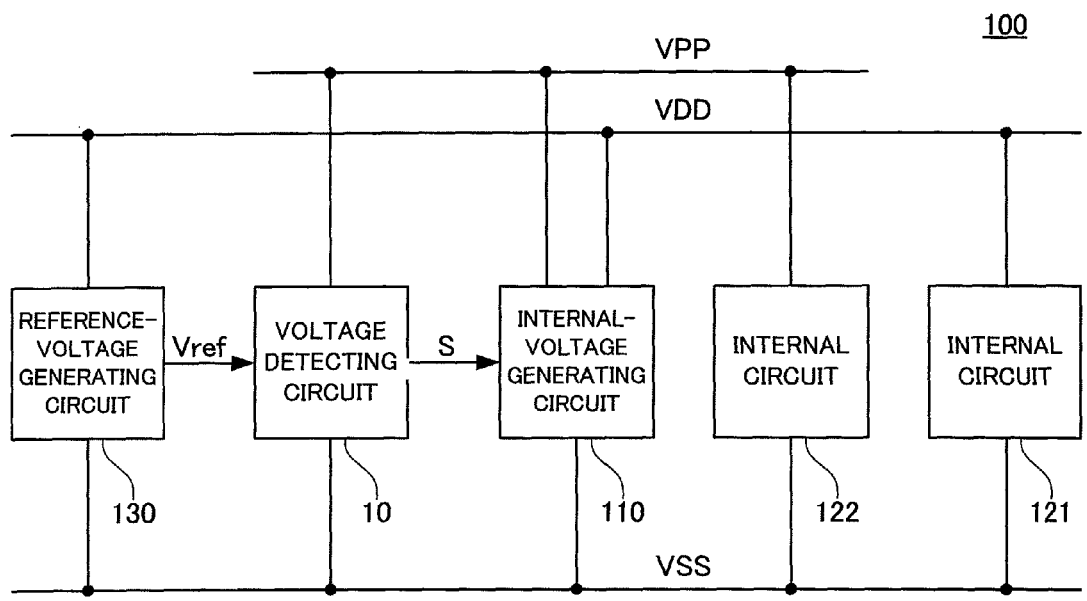
FIG. 1 is a block diagram showing a configuration of main parts of a semiconductor device according to a first embodiment of the present invention.

FIG. 1 is a block diagram showing a configuration of main parts of a semiconductor device according to a first embodiment of the present invention.

A semiconductor device 100 shown in FIG. 1 is operated at a power source voltage VDD supplied from the outside, and includes an internal-voltage generating circuit 110 generating a boosted internal voltage VPP, an internal circuit 121 operated at the power source voltage VDD, and an internal circuit 122 operated at the internal voltage VPP. A kind of the semiconductor device 100 is not particularly limited, and can be a memory semiconductor device such as a DRAM and a flash memory, or can be a processor semiconductor device such as a CPU and a DSP.

The internal voltage VPP generated by the internal-voltage generating circuit 110 is higher than the power source voltage VDD. The power source voltage and the internal voltage are defined by a potential difference between the higher potential and the lower potential, respectively, and the lower potential (VSS) is a ground potential. Therefore, in the first embodiment, the higher potential of the internal voltage VPP is higher than the higher potential of the power source voltage VDD. In the present specification, a difference between the power source voltage and the lower potential VSS can be simply called a "voltage". For example, the power source voltage having a potential difference between the higher potential VDD and the lower potential VSS can be simply expressed as VDD. This is similarly applied to the internal voltage VPP and a reference voltage Vref described later.

The internal circuit 121 operated at the power source voltage VDD is a circuit block that can be operated at a relatively low voltage. On the other hand, the internal circuit 122 operated at the internal voltage VPP is a circuit block that needs to be operated at a relatively high voltage. As one example, when the semiconductor device 100 according to the first embodiment is a DRAM, various control circuits such as an address counter and a command decoder correspond to the internal circuit 121, and a word-line driving circuit activating word lines corresponds to the internal circuit 122.

As shown in FIG. 1, the semiconductor device 100 according to the first embodiment further includes a reference-voltage generating circuit 130 generating a stabilized reference voltage Vref, and a voltage detecting circuit 10 monitoring the internal voltage VPP. The voltage detecting circuit 10 generates the determination signal S by monitoring the internal voltage VPP. The determination signal S is supplied to the internal-voltage generating circuit 110, thereby controlling the boosting operation performed by the internal-voltage generating circuit 110. The reference voltage Vref generated by the reference-voltage generating circuit 130 can be a single potential, or can be configured by plural reference voltages Vref1, Vref2 . . . as described later.

Figure 2:
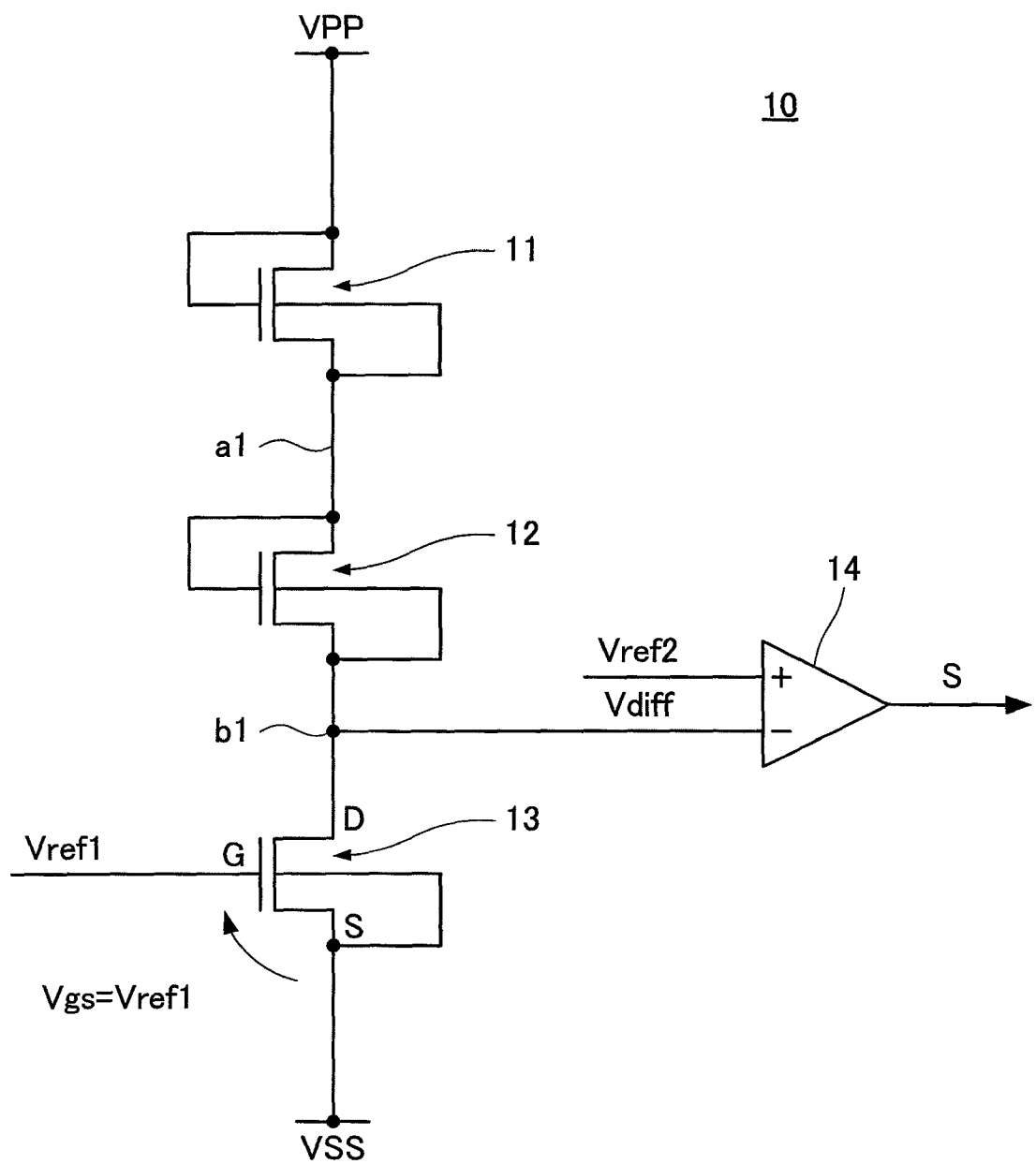
FIG. 2 is a circuit diagram of the voltage detecting circuit according to the first embodiment of the present invention.

FIG. 2 is a circuit diagram of the voltage detecting circuit 10.

The voltage detecting circuit 10 shown in FIG. 2 includes three N-channel MOS transistors 11 to 13 connected in series in this order, between the power source wiring to which the higher potential VPP is supplied and the power source wiring to which the lower potential VSS (usually, the ground potential) is supplied. The three transistors 11 to 13 have mutually equal transistor sizes.

Among these transistors, the two transistors 11 and 12 are diode-connected, having a gate and a drain short-circuited. The rest transistor 13 has a reference voltage Vref1 supplied to the gate. The detection signal Vdiff is output from a connection point between the transistor 12 and the transistor 13, in other words, from a connection point between a source of the transistor 12 and a drain of the transistor 13.

The detection signal Vdiff is supplied to a comparator 14. The comparator 14 compares the reference voltage Vref2 and the detection signal Vdiff, and generates the determination signal S based on this comparison. The determination signal S is supplied to the internal-voltage generating circuit 110 shown in FIG. 1, thereby controlling the boosting operation performed by the internal-voltage generating circuit. A circuit configuration and operation of the internal-voltage generating circuit 110 are described later. The reference voltages Vref1 and Vref2 can be the same potentials, or can be different potentials.

As shown in FIG. 2, because the transistors 11 to 13 are connected in series, mutually equal current flows through these transistors. In the first embodiment, because the reference voltage Vref1 is supplied to the gate of the transistor 13, a gate-source voltage Vgs of the transistor 13 coincides with Vref1.

As described above, because the transistor sizes of the transistors 11 to 13 are mutually equal, when the amounts of flowing current are equal, the gate-source voltages Vgs of the transistors must become equal to each other. Because the transistors 11 and 12 are diode-connected, source-drain voltages of these transistors coincide with Vref1.

As a result, a level of a connection point (a node a1) between the transistors 11 and 12 is given by VPP−Vref1, and a level of a connection point (a node b1) between the transistors 12 and 13, that is, a level of the detection signal Vdiff is given by $$VPP - 2 \times Vref1 \qquad (1).$$

Figure 13:
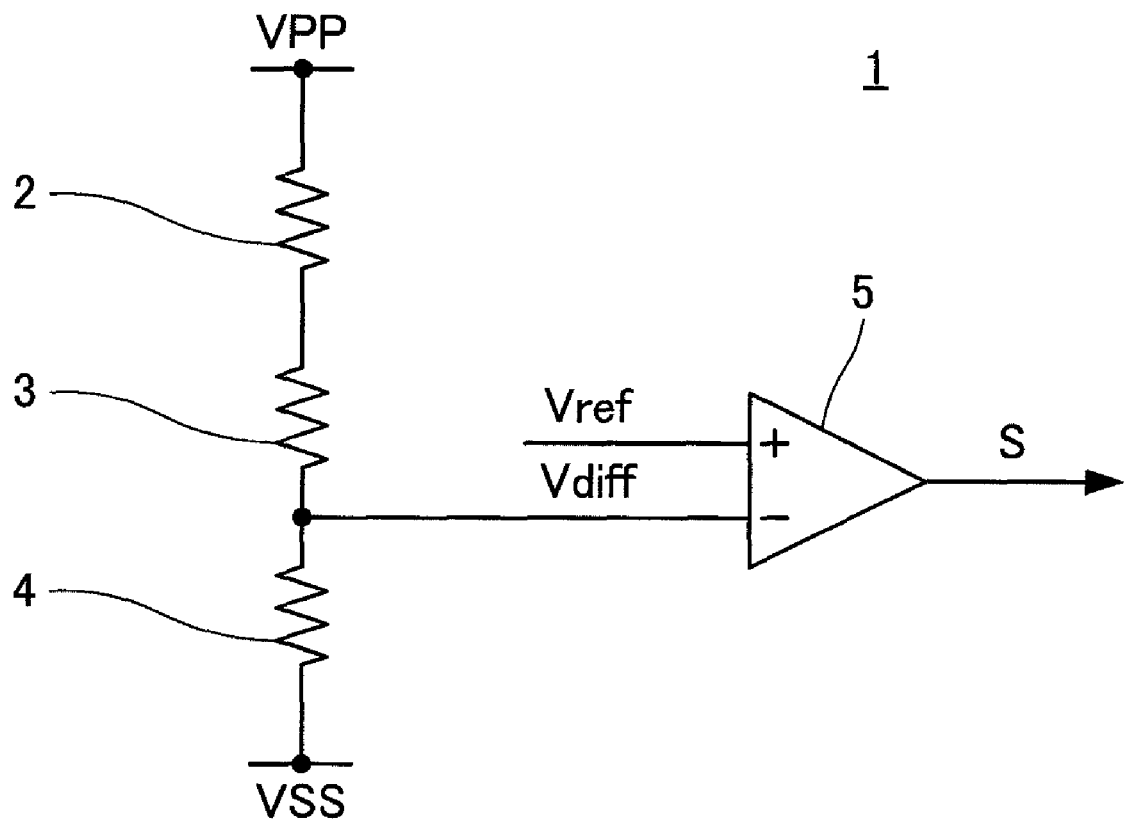
FIG. 13 is a circuit diagram of a voltage detecting circuit according to a related art.

As is clear from the equation (1), a variation of the internal voltage VPP is directly reflected in the detection signal Vdiff. That is, in the voltage detecting circuit according to the related art shown in FIG. 13, the variation amount of the detection signal Vdiff decreases to one third of the variation amount of the internal voltage VPP. However, in the voltage detecting circuit 10 according to the first embodiment, the variation amount of the internal voltage VPP directly becomes the variation amount of the detection signal Vdiff.

Further, because the transistors 11 to 13 are N-channel MOS transistors, and also because the gates of the transistors 11 and 12 are connected to the internal voltage VPP to be detected, the variation of the internal voltage VPP is transmitted with high sensitivity based on the presence of gate-source capacitance. That is, the variation of the internal voltage VPP is directly transmitted to the gate of the transistor 11, and is also transmitted to the source via the gate-source capacitance of the transistor 11. This is similarly applied to the transistor 12. As a result of the presence of this capacitance coupling, the variation of the internal voltage VPP is transmitted with high sensitivity, and response of the detection signal Vdiff can be increased.

The comparator 14 compares the variation of the detection signal Vdiff and the reference voltage Vref2. A logic level of the determination signal S is determined based on a result of this comparison. Therefore, the comparator 14 can monitor the voltage with higher sensitivity than the sensitivity according to conventional techniques.

The comparator 14 sets the determination signal S to a low level, when the level of the detection signal Vdiff is higher than the reference voltage Vref2. Conversely, the comparator 14 sets the determination signal S to a high level, when the level of the detection signal Vdiff is lower than the reference voltage Vref2. As explained above, the generated determination signal S is fed back to the internal-voltage generating circuit 110 shown in FIG. 1.

Figure 3A:
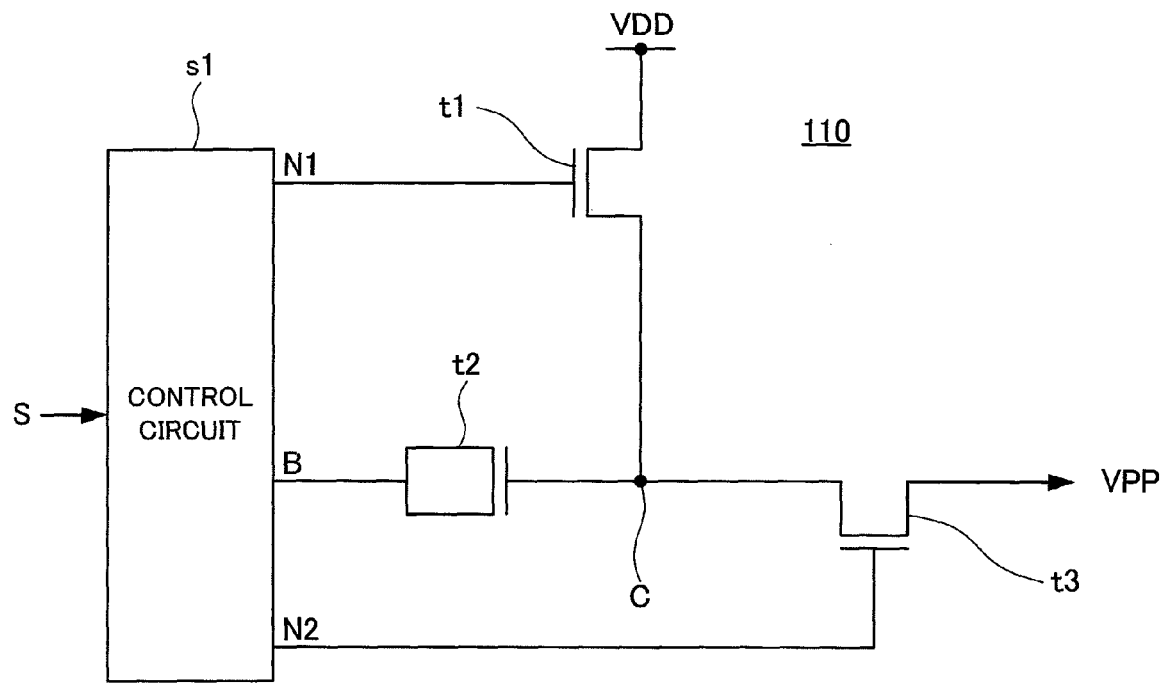
FIG. 3A shows one example of a detailed configuration of an internal-voltage generating circuit according to the first embodiment of the present invention.
Figure 3B:
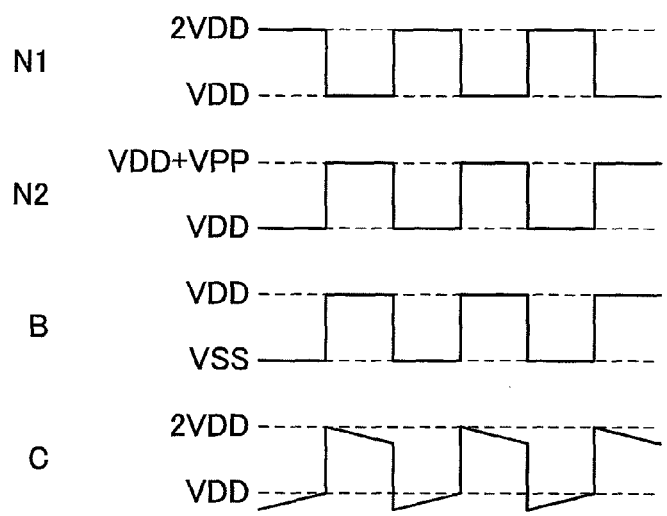
FIG. 3B is an operation waveform diagram thereof.

FIG. 3A shows one example of a detailed configuration of the internal-voltage generating circuit 110, and FIG. 3B is an operation waveform diagram of this circuit.

The internal-voltage generating circuit 110 shown in FIG. 3A generates the internal voltage VPP which is two times of the power source voltage VDD, and includes N-channel MOS transistors t1 to t3, and a control circuit s1 controlling the operation of these transistors.

The transistor t1 is connected between a power source wiring to which the power source voltage VDD is supplied and a node C. The control circuit s1 supplies a control voltage N1 to a gate of the transistor t1. A source and a drain of the transistor t2 are short-circuited, and function as a capacitor. A gate of the transistor t2 is connected to the node C. The control circuit s1 supplies a control voltage B to the source/drain of the transistor t2. The transistor t3 is connected between the node C and an output terminal. The control circuit s1 supplies a control voltage N2 to a gate of the transistor t3. A threshold voltage of the transistor t1 is set to an intermediate voltage between 2VDD and VDD. A threshold voltage of the transistor t3 is set to an intermediate voltage between VDD+VPP1 and VDD.

The internal-voltage generating circuit 110 having this configuration generates the internal voltage VPP as an output, by alternately repeating a charge operation and a pumping operation as shown in FIG. 3B.

The charge operation is performed by setting the control voltages N1, B, and N2 to 2VDD, VSS, and VDD, respectively. As a result, the transistor t1 is turned on, and the transistor t3 is turned off. Accordingly, a charging of the transistor t2 is started, and a voltage of the node C is charged to VDD as shown in FIG. 3B.

The pumping operation is performed by setting the control voltages N1, B, and N2 to VDD, VDD, and VDD+VPP1, respectively. As a result, the transistor t1 is turned off, and the transistor t3 is turned on. Accordingly, a total voltage 2VDD of the charge voltage and the voltage B of the transistor t2 is output to an output terminal of the internal-voltage generating circuit 110.

By alternately repeating this operation, the internal voltage VPP as the output of the internal-voltage generating circuit 110 is boosted to two times of the power source voltage VDD. However, the generated internal voltage VPP varies depending on the load. In order to stabilize the internal voltage VPP, the duty of the control voltage needs to be changed. This control is performed by the control circuit s1, based on a logic level of the determination signal S. As a result, the internal voltage VPP as the output of the internal-voltage generating circuit 110 is stabilized.

Figure 4A:
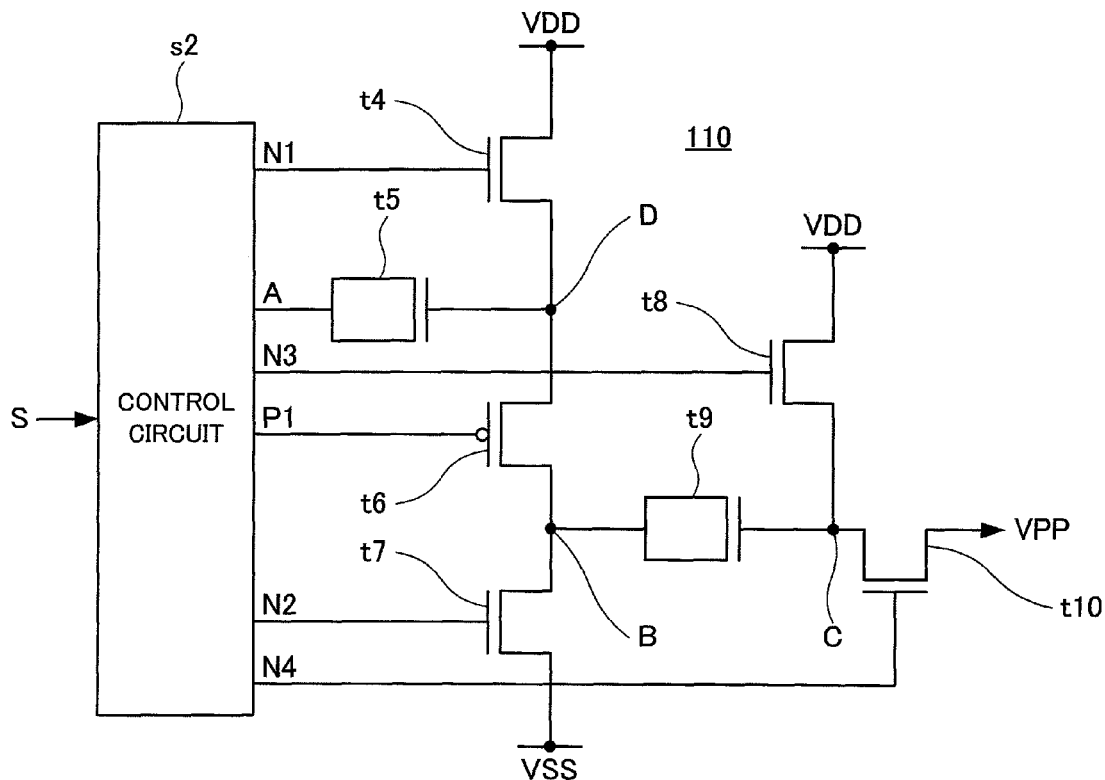
FIG. 4A shows other example of a detailed circuit configuration of the internal-voltage generating circuit according to the first embodiment of the present invention.
Figure 4B:
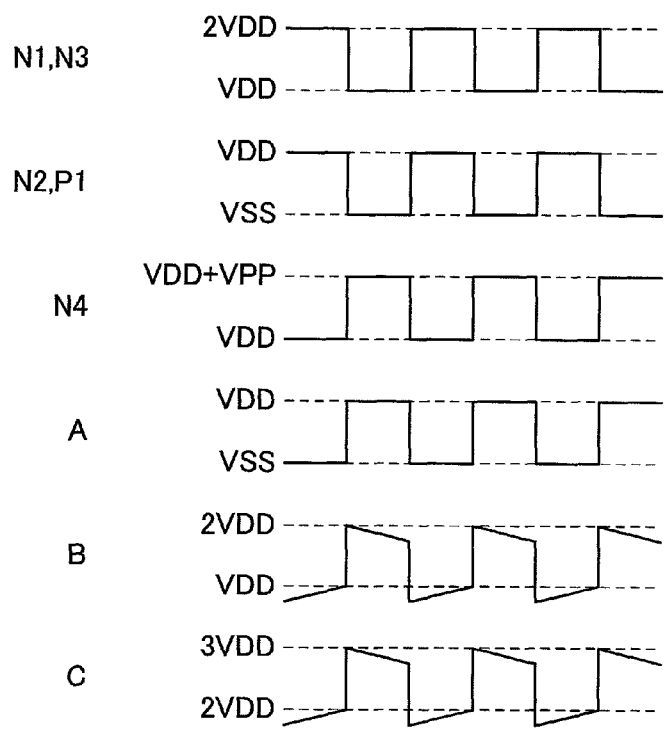
FIG. 4B is an operation waveform diagram thereof.

FIG. 4A shows other example of a detailed circuit configuration of the internal-voltage generating circuit 110, and FIG. 4B is an operation waveform diagram of the internal-voltage generating circuit 110.

The internal-voltage generating circuit 110 shown as an example in FIG. 4A is a circuit generating the internal voltage VPP which is three times of the power source voltage VDD, and includes N-channel MOS transistors t4, t5, and t7 to t10, P-channel MOS transistor t6, and a control circuit s2 controlling the operation of these transistors.

The transistors t4, t6, and t7 are connected in series between VDD and VSS. The control circuit s2 supplies control voltages N1, P1, and N2 to the gates of these transistors, respectively. The transistor t5 has a source and a drain short-circuited, and functions as a capacitor. A gate of the transistor t5 is connected to a node D. The control circuit s2 supplies a control voltage A to the source/drain of the transistor t5. The transistors t8 to t10 correspond to the transistors t1 to t3 shown in FIG. 3A.

The control circuit s2 controls the voltages N1, N2, N3, N4, P1, A, B, and C in a similar manner to that of the control circuit s1 explained with reference to FIGS. 3A and 3B. The control circuit s2 causes VPP=3VDD to be output to the output terminal of the internal-voltage generating circuit 110. In the example shown in FIGS. 4A and 4B, the control circuit s2 also causes a duty of each control voltage to be changed based on the logic level of the determination signal S, thereby stabilizing the internal voltage VPP.

The circuits shown in FIG. 3A and FIG. 4A are only one example, respectively of the internal-voltage generating circuit 110, and the internal-voltage generating circuit 110 can take a configuration different from these configurations.

As explained above, according to the first embodiment, a variation of the internal voltage VPP is directly reflected in the detection signal. Therefore, the comparator 14 can perform a voltage determination with high sensitivity. As a result, a level of the internal voltage generated by the internal-voltage generating circuit 110 can be more stabilized.

Figure 5:
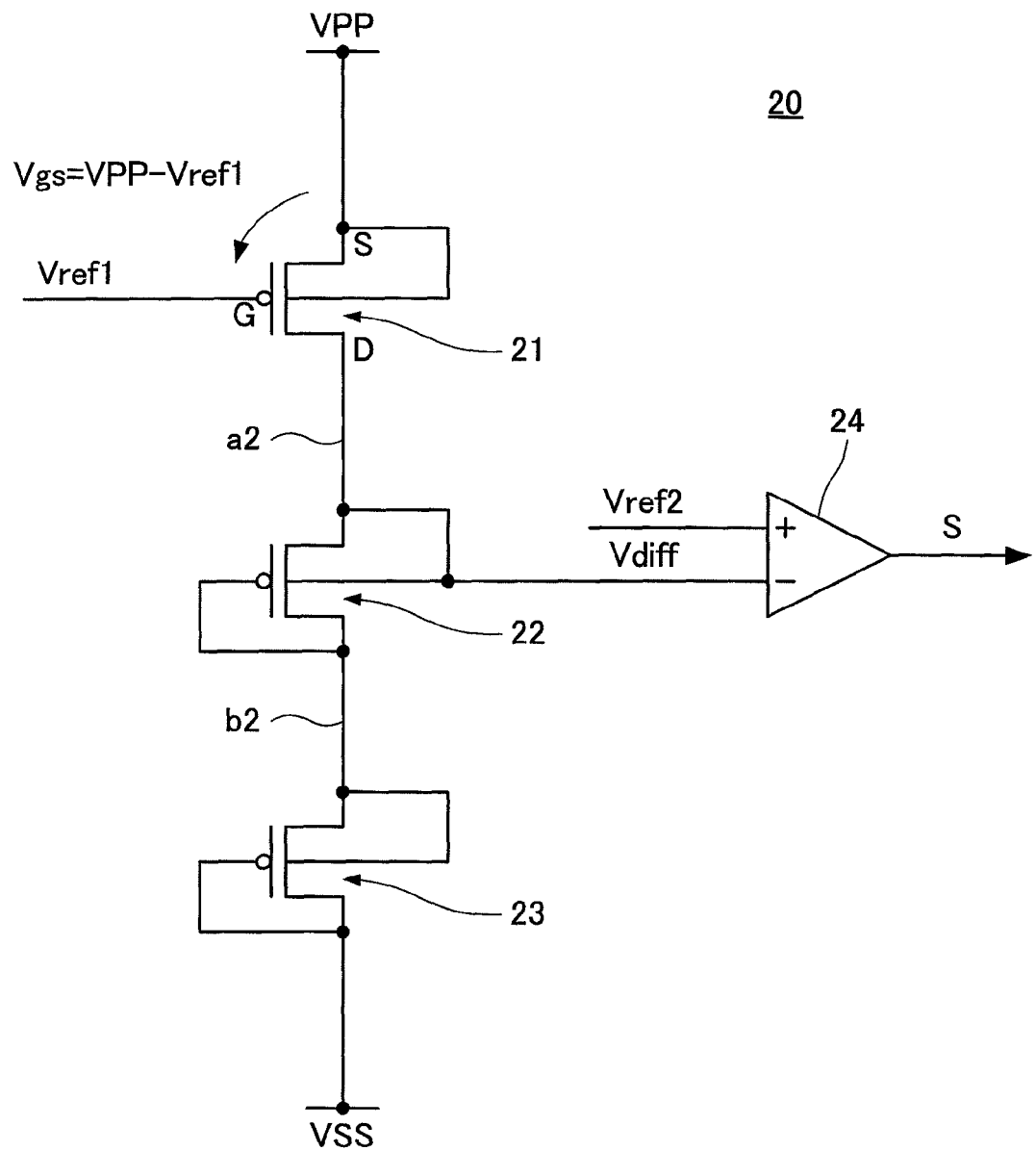
FIG. 5 is a circuit diagram of a voltage detecting circuit according to a modification of the first embodiment of the present invention.

FIG. 5 is a circuit diagram of a voltage detecting circuit 20 according to a modification of the first embodiment.

The voltage detecting circuit 20 shown in FIG. 5 can be used instead of the voltage detecting circuit 10 shown in FIG. 2, and includes three P-channel MOS transistors 21 to 23 connected in series between a pair of power source lines. The three transistors 21 to 23 have mutually the same transistor sizes.

Among these transistors, the two transistors 22 and 23 are diode-connected, having a gate and a drain short-circuited. The rest transistor 21 has the reference voltage Vref1 supplied to a gate. The detection signal Vdiff is output from a connection point between the transistor 21 and the transistor 22, in other words, from a connection point between a drain of the transistor 21 and a source of the transistor 22. The detection signal Vdiff is supplied to a comparator 24. The comparator 24 compares the detection signal Vdiff and the reference voltage Vref2.

As shown in FIG. 5, because the transistors 21 to 23 are connected in series, mutually equal current flows through these transistors. In the modification of the first embodiment, because the reference voltage Vref1 is supplied to the gate of the transistor 21, the gate-source voltage Vgs of the transistor 21 coincides with VPP-Vref1.

As described above, because the transistor sizes of the transistors 21 to 23 are mutually equal, when the amounts of flowing current are equal, the gate-source voltages Vgs of the transistors must become equal to each other. Because the transistors 22 and 23 are diode-connected, source-drain voltages of these transistors also coincide with VPP-Vref1.

As a result, a level of a connection point (a node b2) between the transistors 22 and 23 is given by VPP-Vref1 and a level of a connection point (a node a2) between the transistors 21 and 22, that is, a level of the detection signal Vdiff is given by $$2\times VPP-2\times Vref1 \quad (2).$$

As is clear from the equation (2), a variation of the internal voltage VPP is amplified to two times, in the detection signal Vdiff. Therefore, the comparator 24 can monitor a voltage with higher sensitivity. Amplification of the variation coincides with a number of transistors that are diode-connected between the node a2 and the VSS potential. Therefore, when one transistor is present between the node a2 and the VSS potential, the amplification becomes one time, and when three transistors are present between the node a2 and the VSS potential, the amplification becomes three times.

As described above, when the source of the transistor is connected to the power source wiring to which a voltage (the internal voltage VPP in the first embodiment) is to be detected, the amplified detection signal Vdiff can be obtained.

A second embodiment of the present invention is explained next.

Figure 6:
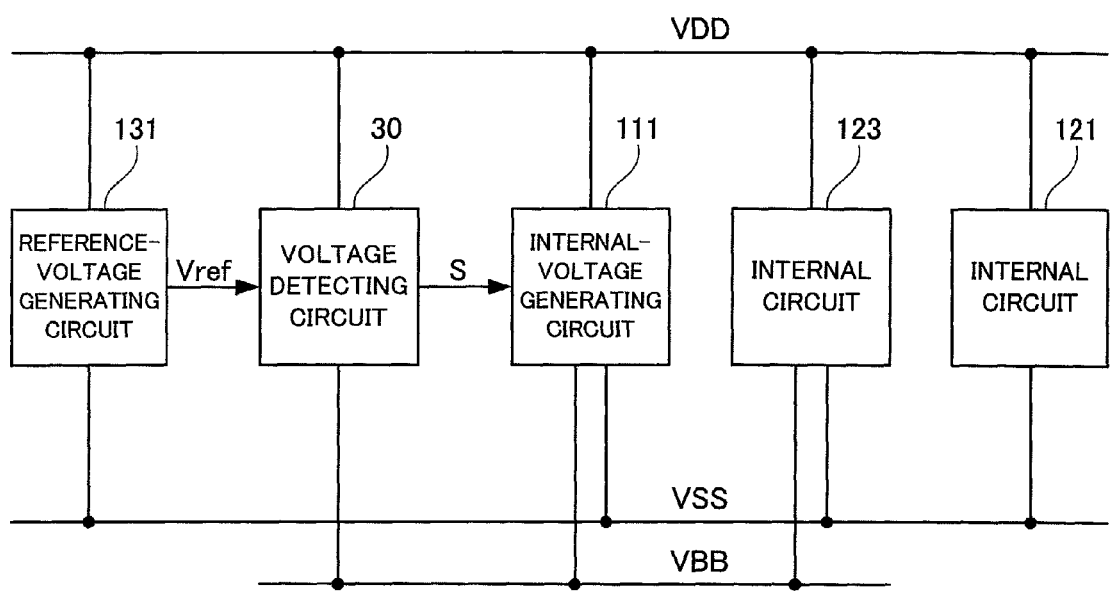
FIG. 6 is a block diagram showing a configuration of main parts of a semiconductor device according to a second embodiment of the present invention.

FIG. 6 is a block diagram showing a configuration of main parts of a semiconductor device according to the second embodiment. Circuit elements identical with those of the semiconductor device 100 are denoted by like reference numerals.

A semiconductor device 101 shown in FIG. 6 is also operated at the power source voltage supplied from the outside, in the same manner as that of the semiconductor device 100. The semiconductor device 101 includes a reference-voltage generating circuit 131 generating the stabilized reference voltage Vref, a voltage detecting circuit 30 monitoring an internal voltage VBB, an internal-voltage generating circuit 111 generating the internal voltage VBB lower than the VSS, and an internal circuit 123 operated at the internal voltage VBB.

The internal circuit 123 operated at the internal voltage VBB is a circuit block requiring a supply of a minus voltage.

The voltage detecting circuit 30 generates the determination signal S by monitoring the internal voltage VBB. The determination signal S is supplied to the internal-voltage generating circuit 111, thereby controlling a VBB generation operation performed by the internal-voltage generating circuit 111.

The reference voltage Vref generated by the reference-voltage generating circuit 131 includes two reference voltages Vref3 and Vref4.

Figure 7:
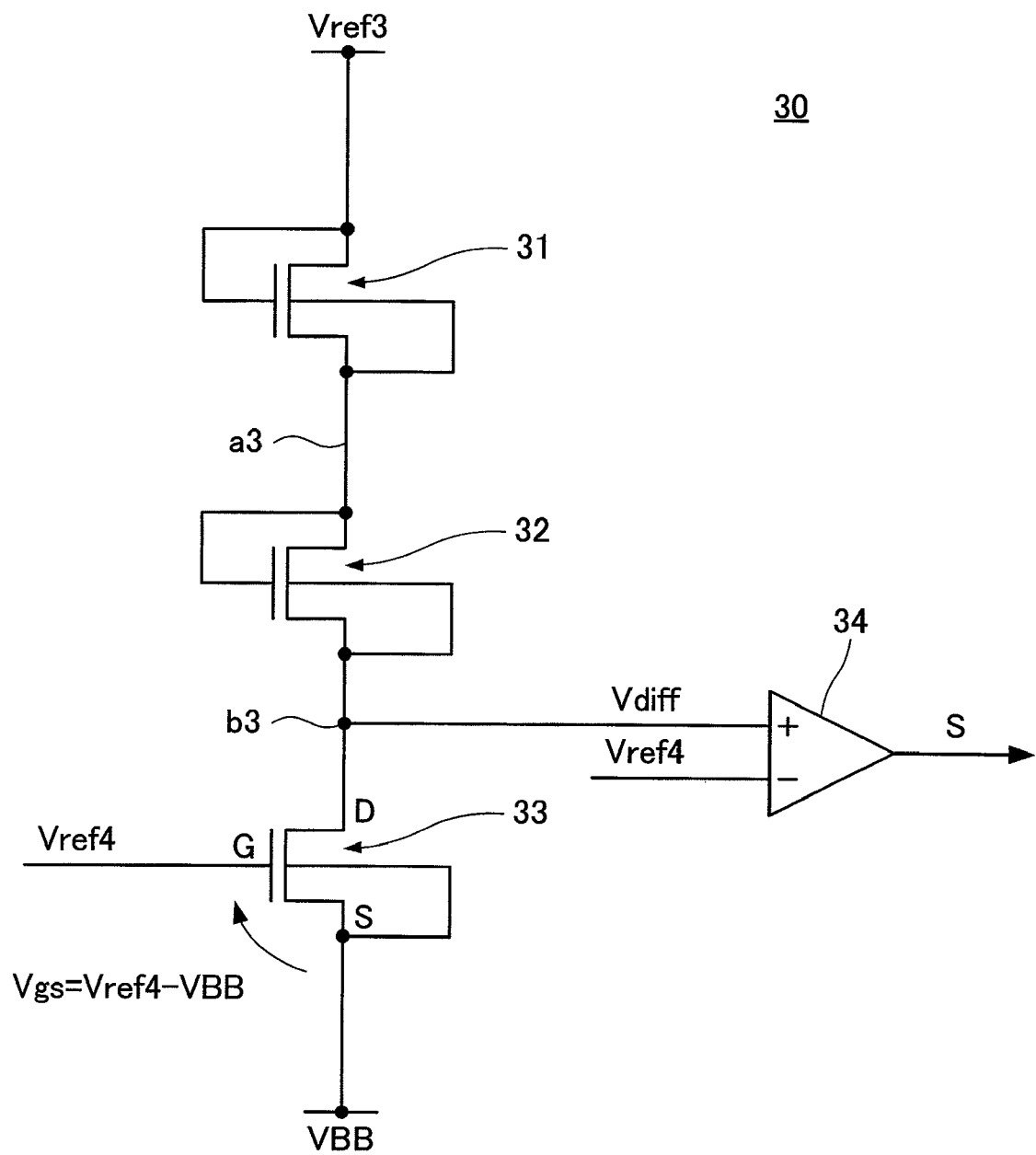
FIG. 7 is a circuit diagram of the voltage detecting circuit according to the second embodiment of the present invention.

FIG. 7 is a circuit diagram of the voltage detecting circuit 30.

The voltage detecting circuit 30 shown in FIG. 7 includes three N-channel MOS transistors 31 (a third transistor), 32 (a second transistor), and 33 (a first transistor) connected in series in this order, between a wiring (a second wiring) to which the potential Vref3 is supplied from the reference-voltage generating circuit 131 and a power source wiring (a first wiring) to which the voltage VBB is supplied. The three transistors 31 to 33 have mutually equal transistor sizes.

Among these transistors, the two transistors 31 and 32 are diode-connected, having a gate and a drain short-circuited. The rest transistor 33 has the reference voltage Vref4 (the first reference voltage) supplied to the gate. The detection signal Vdiff is output from a connection point between the transistor 32 and the transistor 33, in other words, from a connection point between a source of the transistor 32 and a drain of the transistor 33.

The detection signal Vdiff is supplied to a comparator 34. The comparator 34 compares the reference voltage Vref4 and the detection signal Vdiff, and generates the determination signal S based on this comparison. The determination signal S is supplied to the internal-voltage generating circuit 111 shown in FIG. 6, thereby controlling the VBB generation operation performed by the internal-voltage generating circuit 111.

As shown in FIG. 7, because the transistors 31 to 33 are connected in series, mutually equal current flows through these transistors. In the second embodiment, because the reference voltage Vref4 is supplied to the gate of the transistor 33, a gate-source voltage Vgs of the transistor 33 coincides with Vref4-VBB.

As described above, because the transistor sizes of the transistors 31 to 33 are mutually equal, when the amounts of flowing current are equal, the gate-source voltages Vgs of the transistors must become equal to each other. Because the transistors 31 and 32 are diode-connected, source-drain voltages of these transistors also coincide with Vref4-VBB.

As a result, a level of a connection point (a node a3) between the transistors 31 and 32 is given by Vref3-(Vref4-VBB), and a level of a connection point (a node b3) between the transistors 32 and 33, that is, a level of the detection signal Vdiff is given by $$Vref3-2\times(Vref4-VBB) \quad (3).$$

As is clear from the equation (3), a variation of the internal voltage VBB is amplified to two times, in the detection signal Vdiff. Therefore, the comparator 34 can monitor a voltage with higher sensitivity. Amplification of the variation coincides with a number of transistors that are diode-connected between the node b3 and the Vref3 potential. Therefore, when one transistor is present between the node b3 and the Vref3 potential, the amplification becomes one time, and when three transistors are present between the node b3 and the Vref3 potential, the amplification becomes three times.

The comparator 34 compares a variation of the detection signal Vdiff and the reference voltage Vref4. A logic level of the determination signal S is determined based on a result of the comparison. Therefore, the comparator 34 can monitor the voltage with higher sensitivity than the sensitivity according to conventional techniques.

The comparator 34 sets the determination signal S to a low level, when the level of the detection signal Vdiff is lower than the reference voltage Vref4. Conversely, the comparator 34 sets the determination signal S to a high level, when the level of the detection signal Vdiff is higher than the reference voltage Vref2. As explained above, the generated determination signal S is fed back to the internal-voltage generating circuit 111 shown in FIG. 6.

As explained above, according to the second embodiment, the variation of the internal voltage VBB is increased to two times, and this is reflected in the detection signal Vdiff. Therefore, the comparator 34 can perform the voltage determination with high sensitivity. As a result, the level of the internal voltage VBB generated by the internal-voltage generating circuit 111 can be stabilized.

Figure 8:
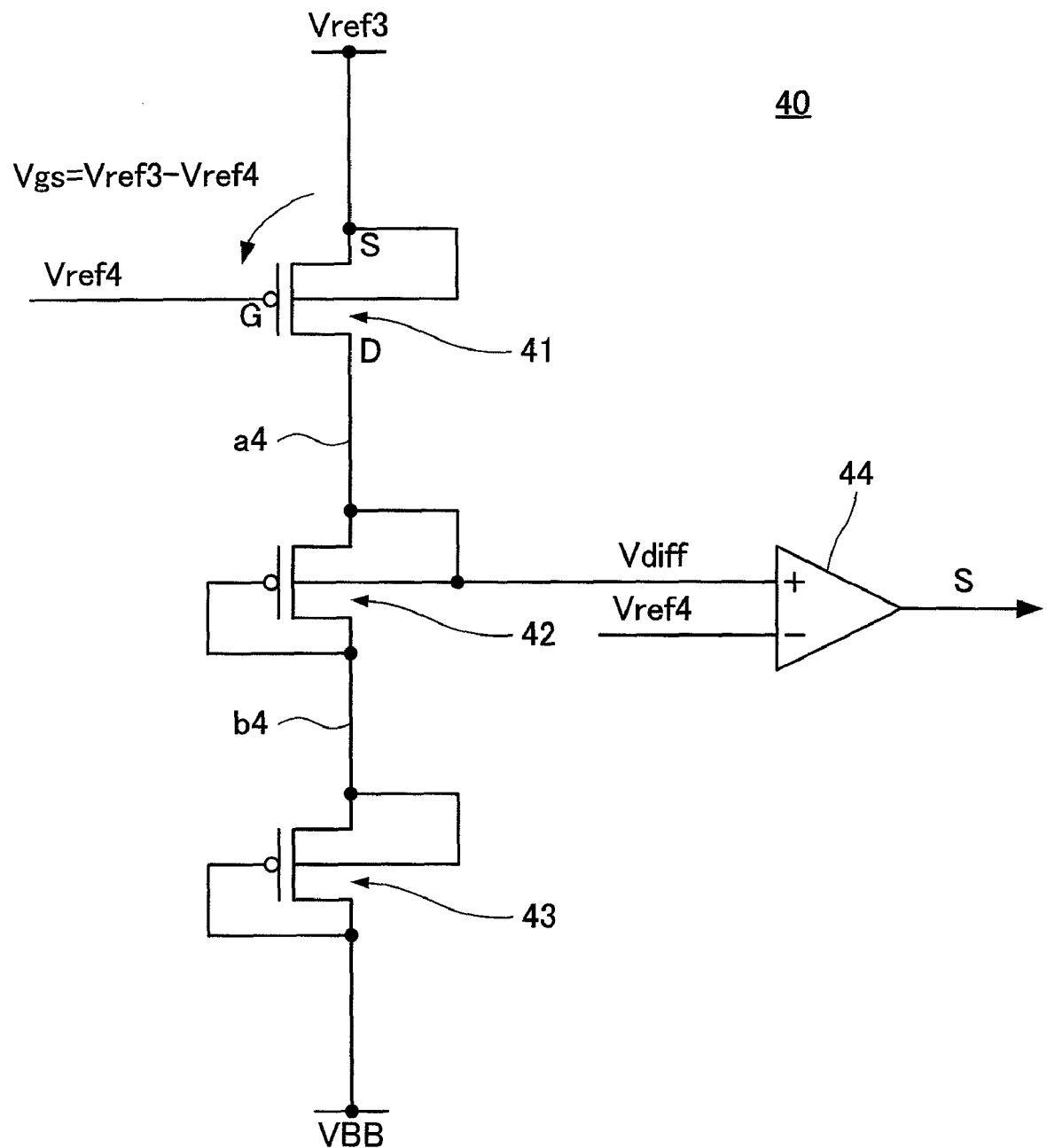
FIG. 8 is a circuit diagram of a voltage detecting circuit according to a modification of the second embodiment of the present invention.

FIG. 8 is a circuit diagram of a voltage detecting circuit 40 according to a modification of the second embodiment.

The voltage detecting circuit 40 shown in FIG. 8 can be used instead of the voltage detecting circuit 30 shown in FIG. 7, and includes three P-channel MOS transistors 41 to 43 connected in series between the wiring to which the potential Vref3 is supplied and the power source wiring to which the voltage VBB is supplied. The three transistors 41 to 43 have mutually the same transistor sizes.

Among these transistors, the two transistors 42 and 43 are diode-connected, having a gate and a drain short-circuited. The rest transistor 41 has the reference voltage Vref4 supplied to a gate. The detection signal Vdiff is output from a connection point between the transistor 41 and the transistor 42, in other words, from a connection point between a drain of the transistor 41 and a source of the transistor 42. The detection signal Vdiff is supplied to a comparator 44. The comparator 44 compares the detection signal Vdiff and the reference voltage Vref4.

As shown in FIG. 8, because the transistors 41 to 43 are connected in series, mutually equal current flows through these transistors. In the second embodiment, because the reference voltage Vref4 is supplied to the gate of the transistor 41, the gate-source voltage Vgs of the transistor 41 is given by Vref3-Vref4.

As described above, because the transistor sizes of the transistors 41 to 43 are mutually equal, when the amounts of flowing current are equal, the gate-source voltages Vgs of the transistors must become equal to each other. Because the transistors 42 and 43 are diode-connected, source-drain voltages of these transistors are also given by Vref3-Vref4.

As a result, a level of a connection point (a node b4) between the transistors 42 and 43 is given by VBB+Vref3-Vref4, and a level of a connection point (a node a4) between the transistors 41 and 42, that is, a level of the detection signal Vdiff is given by $$VBB+2\times(Vref3-Vref4) \quad (4).$$

As is clear from the equation (4), a variation of the internal voltage VBB is directly reflected, in the detection signal Vdiff. Therefore, the comparator 44 can monitor a voltage with higher sensitivity.

A third embodiment of the present invention is explained next.

Figure 9:
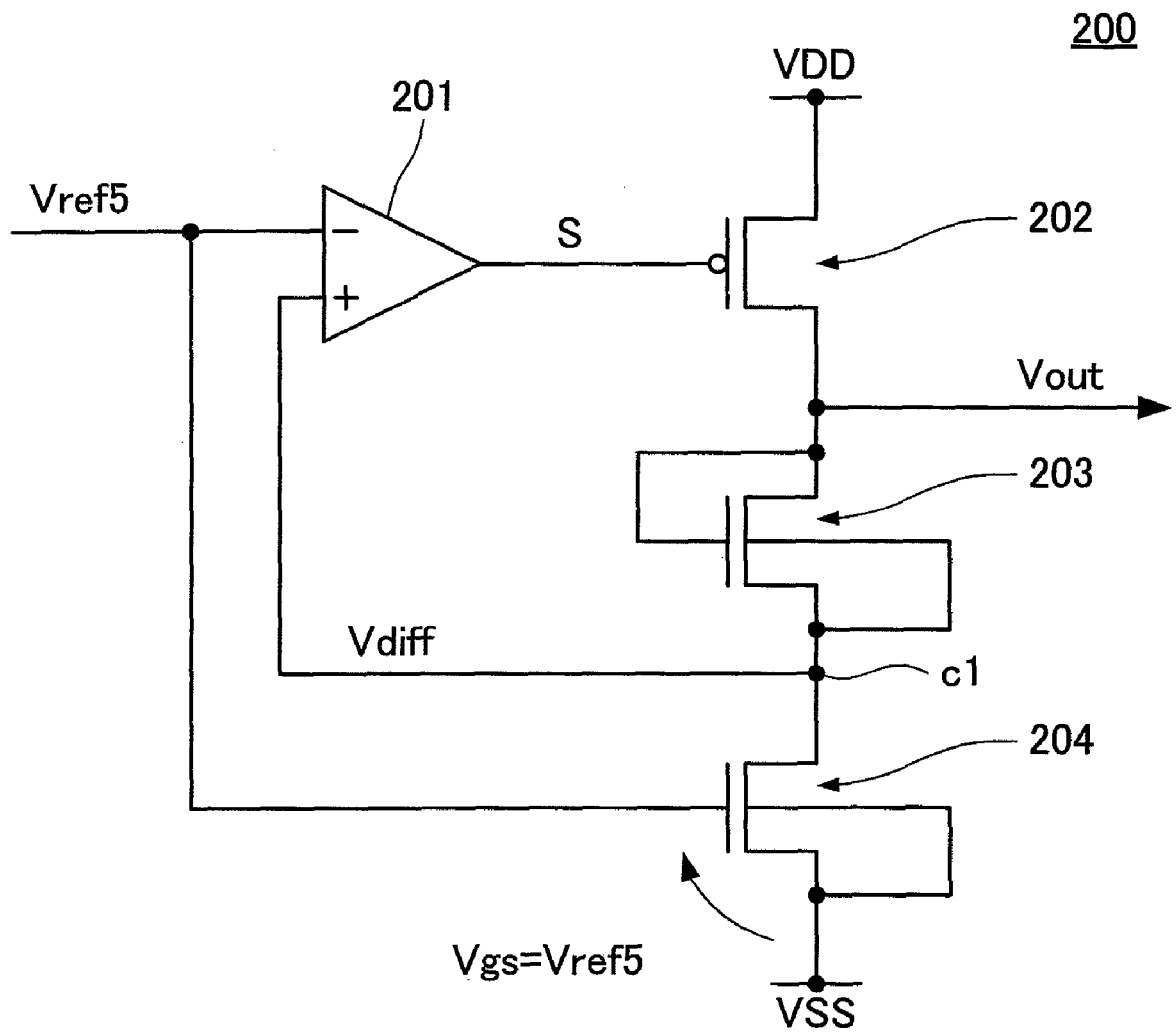
FIG. 9 is a circuit diagram showing an internal-voltage-drop power-source generating circuit according to a third embodiment of the present invention.

FIG. 9 is a circuit diagram showing an internal-voltage-drop power-source generating circuit according to the third embodiment.

An internal-voltage-drop power-source generating circuit 200 shown in FIG. 9 generates a voltage Vout by dropping the power source voltage supplied from the outside, and also has a function of a voltage detecting circuit. This semiconductor device 200 is also provided within a memory semiconductor device such as a DRAM and a flash memory and a processor semiconductor device such as a CPU and a DSP.

Two examples of an internal-voltage-drop power-source generating circuit according to related arts of the present invention are explained first. Thereafter, the semiconductor device 200 is explained in detail.

Figure 14:
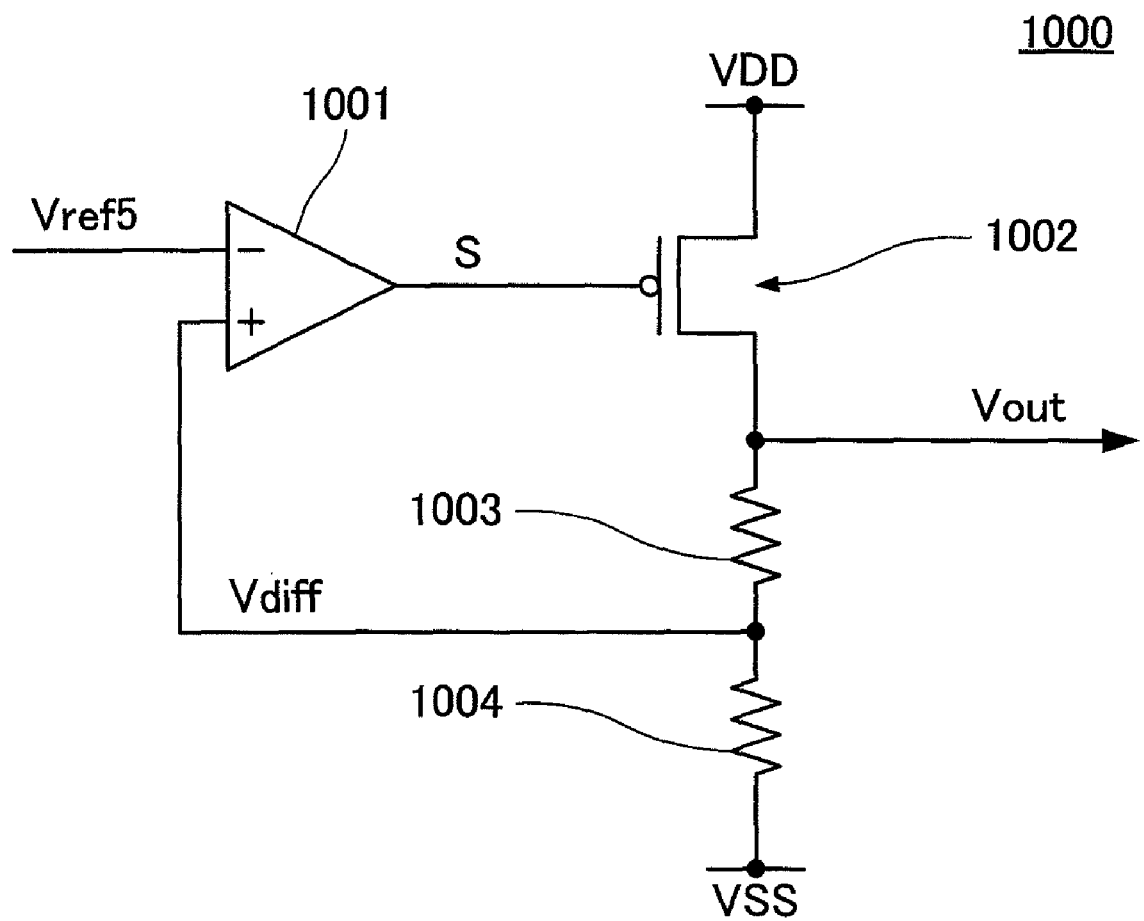
FIG. 14 is a circuit diagram of an internal-voltage-drop power-source generating circuit according to a first related art.

FIG. 14 is a circuit diagram of an internal-voltage-drop power-source generating circuit 1000 according to a first related art. The internal-voltage-drop power-source generating circuit 1000 includes a comparator 1001, a P-channel MOS transistor 1002, and resistors 1003 and 1004. The transistor 1002, and the resistors 1003 and 1004 are connected in series in this order between the power source wiring to which the higher potential VDD is supplied and the power source wiring to which the lower potential VSS is supplied. A reference voltage Vref5 is supplied to an inverted input terminal of the comparator 1001, and a non-inverted input terminal of the comparator 1001 is connected to a connection point between the resistors 1003 and 1004. The voltage Vout is extracted from a connection point between the transistor 1002 and the resistor 1003.

Resistances of the resistor 1003 and the resistor 1004 are set to the same values. As a result, a detection signal Vdiff=(½)Vout is input to the non-inverted input terminal of the comparator 1001. Accordingly, the comparator 1001 compares (½)Vout and Vref5. The comparator 1001 generates the determination signal S reflecting a result of the comparison, and outputs this determination signal S to a gate of the transistor 1002, thereby adjusting Vout.

Because a half value of Vout is input to the comparator 1001, a variation amount of Vout also becomes a half. Therefore, according to the internal-voltage-drop power-source generating circuit 1000, the comparator 1001 has low sensitivity of a voltage variation, and has been difficult to sufficiently stabilize the internal voltage.

Figure 15:
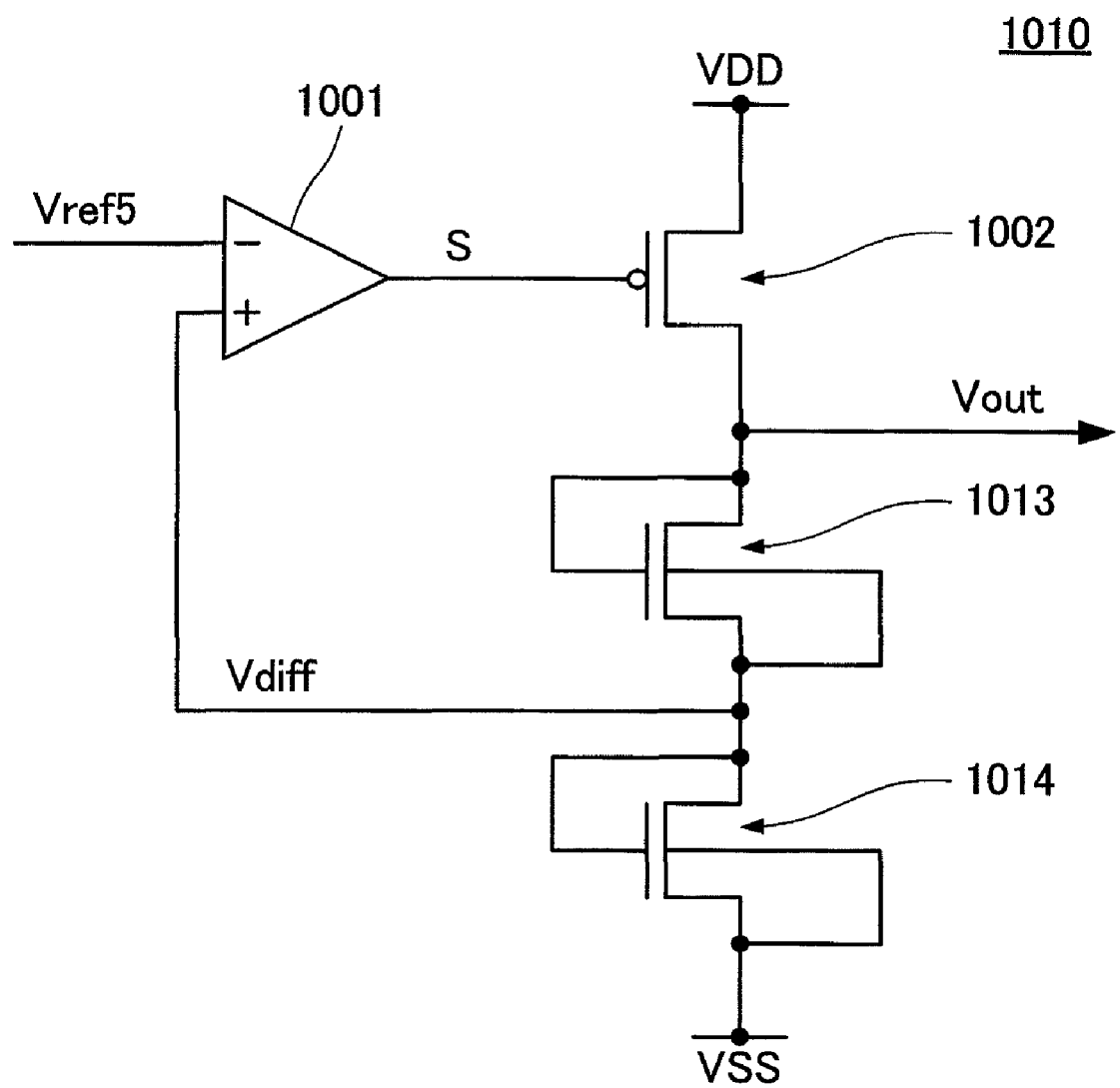
FIG. 15 is a circuit diagram of an internal-voltage-drop power-source generating circuit according to a second related art.

FIG. 15 is a circuit diagram of an internal-voltage-drop power-source generating circuit 1010 according to a second related art. The internal-voltage-drop power-source generating circuit 1010 includes N-channel MOS transistors 1013 and 1014, in place of the resistors 1003 and 1004 of the internal-voltage-drop power-source generating circuit 1000. The transistors 1013 and 1014 are diode-connected. The non-inverted input terminal of the comparator 1001 is connected to a connection point between the transistors 1013 and 1014. The voltage Vout is extracted from a connection point between the transistor 1002 and the transistor 1013.

The transistor 1013 and the transistor 1014 have mutually equal transistor sizes. As a result, the detection signal Vdiff=(½)Vout is input to the non-inverted input terminal of the comparator 1001. Therefore, according to the internal-voltage-drop power-source generating circuit 1010, the comparator 1001 also has low sensitivity of voltage variation, and has been difficult to sufficiently stabilize the internal voltage, like the internal-voltage-drop power-source generating circuit 1000.

The semiconductor device 200 according to the third embodiment is explained next. As shown in FIG. 9, the internal-voltage-drop power-source generating circuit 200 includes a comparator 201, a P-channel MOS transistor 202 (a third transistor), and N-channel MOS transistors 203 (a second transistor) and 204 (a first transistor). The transistors 202, 203, and 204 are connected in series in this order between the power source wiring (a second wiring) to which the higher potential VDD is supplied and the power source wiring (a first wiring) to which the lower potential VSS is supplied. The transistor 203 is diode-connected. Further, the reference voltage Vref5 is supplied to the inverted input terminal of the comparator 201, and the non-inverted input terminal of the comparator 201 is connected to a connection point between the transistors 203 and 204. The reference voltage Vref5 is also supplied to a gate of the transistor 204. The voltage Vout is extracted from a connection point between the transistor 202 and the transistor 203. Further, the transistors 203 and 204 have mutually the same sizes.

In this case, the gate-source voltage Vgs of the transistor 204 becomes Vref5. As described above, because the transistor sizes of the transistors 203 and 204 are mutually equal, when the amounts of flowing current are equal, the gate-source voltages Vgs of the transistors must also become equal. Because the transistor 203 is diode-connected, the source-drain voltage of the transistor 203 is also given by Vref5.

As a result, a level of a connection point (a node c1) between the transistors 203 and 204, that is, a level of the detection signal Vdiff input to the non-inverted input terminal of the comparator 201 is given by $$\text{Vout}-\text{Vref5} \qquad (5)$$

As is clear from the equation (5), a variation of the voltage Vout is directly reflected in the detection signal Vdiff. That is, in the internal-voltage-drop power-source generating circuits shown in FIG. 14 and FIG. 15, a variation amount of the signal input to the non-inverted input terminal of the comparator 31 decreases by one half of the variation amount of the voltage Vout. On the other hand, in the internal-voltage-drop power-source generating circuit 200 according to the third embodiment, the variation amount of the voltage Vout is directly reflected in the input to the non-inverted input terminal of the comparator 201.

The comparator 201 compares the variation of the detection signal Vdiff and the reference voltage Vref5. A logic level of the output signal of the comparator is determined based on a result of the comparison. Therefore, the comparator 201 can monitor the voltage with higher sensitivity than the sensitivity according to conventional techniques.

The comparator 201 sets the determination signal S to a low level, when the level of the detection signal Vdiff is higher than the reference voltage Vref2. Conversely, the comparator 201 sets the determination signal S to a high level, when the level of the detection signal Vdiff is lower than the reference voltage Vref2. The on and off of the transistor 202 are controlled by the determination signal S generated in this way. As a result, a result of the determination by the comparator 201 is fed back to the voltage Vout.

As explained above, according to the third embodiment, the variation of the internal voltage Vout is directly reflected in the detection signal Vdiff. Therefore, the comparator 201 can perform the voltage determination with high sensitivity. As a result, the level of the voltage Vout generated by the internal-voltage-drop power-source generating circuit 200 can be stabilized more stably.

Figure 10:
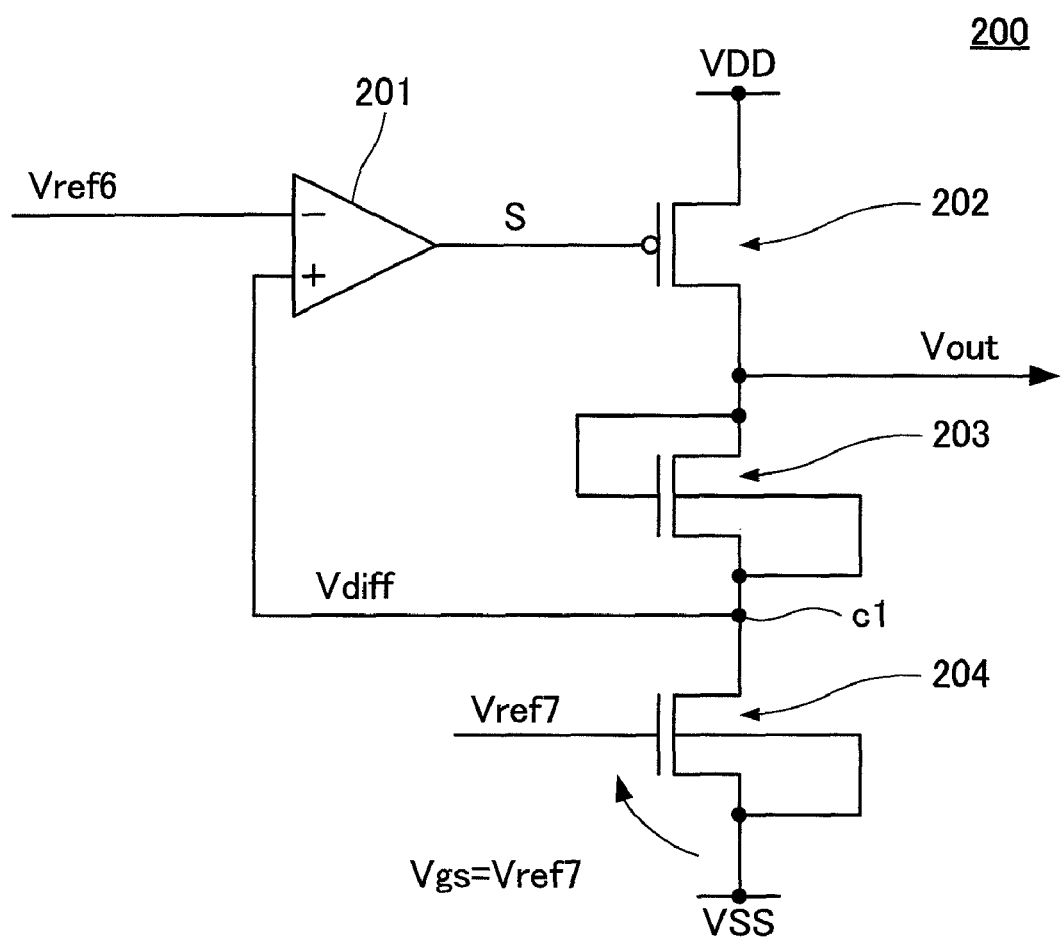
FIG. 10 is a circuit diagram showing an internal-voltage-drop power-source generating circuit according to a modification of the third embodiment of the present invention.

In the internal-voltage-drop power-source generating circuit 200 shown in FIG. 9, while like reference voltage Vref5 is supplied to the comparator 201 and the transistor 204, mutually different reference voltages can be also supplied to the comparator 201 and the transistor 204, as shown in FIG. 10.

In the example shown in FIG. 10, a reference voltage Vref6 is supplied to the comparator 201, and a reference voltage Vref7 is supplied to the transistor 204. In this case, the voltage Vout is adjusted to Vref6+Vref7. While a relationship between the reference voltages Vref6 and Vref7 is not particularly limited, preferably, Vref7 is set higher than Vref6. According to this, the gate-source voltage Vgs=Vref7 of the transistor 204 can be sufficiently secured, and the operation can be stabilized at a low voltage.

Figure 11:
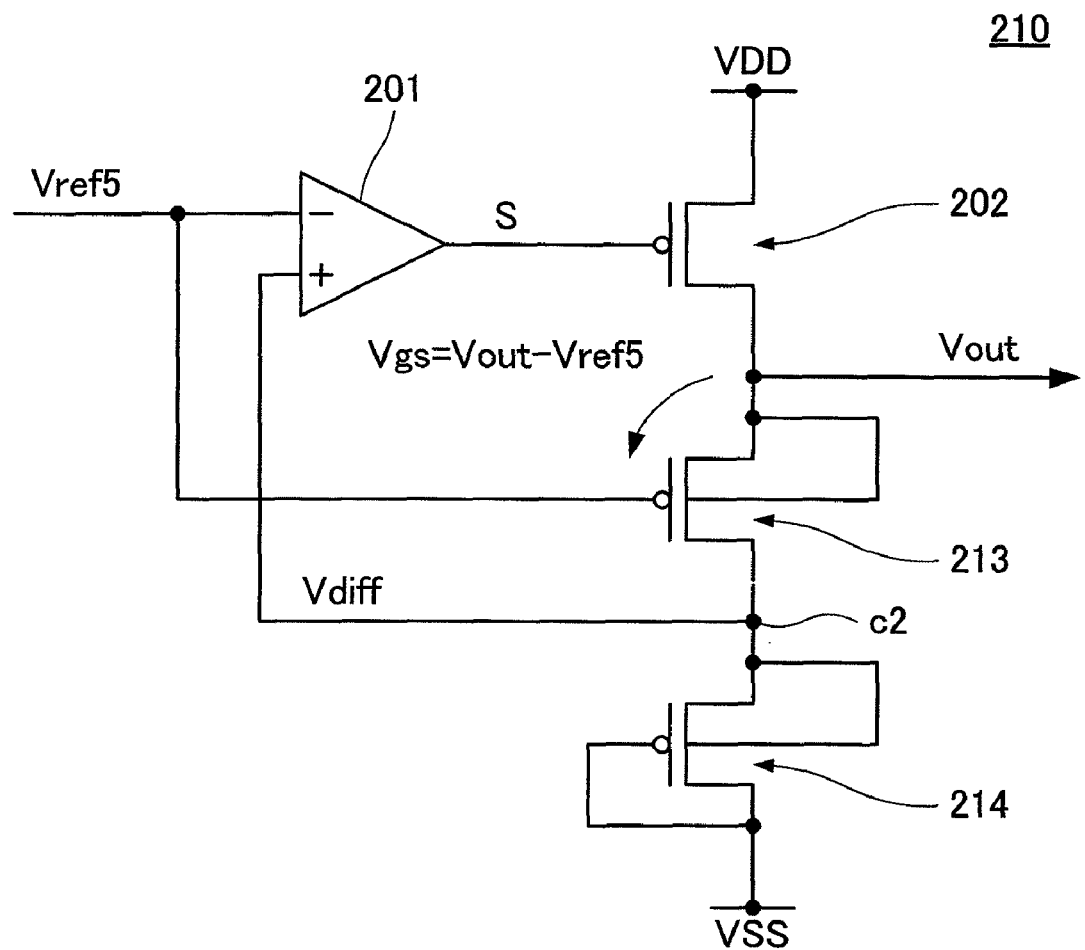
FIG. 11 is a circuit diagram of an internal-voltage-drop power-source generating circuit according to another modification of the third embodiment.

FIG. 11 is a circuit diagram of an internal-voltage-drop power-source generating circuit according to a modification of the third embodiment.

An internal-voltage-drop power-source generating circuit 210 shown in FIG. 11 can be used in place of the internal-voltage-drop power-source generating circuit 200 shown in FIG. 9, and includes P-channel MOS transistors 213 and 214 in place of the N-channel MOS transistors 203 and 204.

In the internal-voltage-drop power-source generating circuit 210, the transistors 202 (a third transistor), 213 (a first transistor), 214 (a second transistor) are connected in series in this order between the power source wiring (a first wiring) to which the higher potential VDD is supplied and the power source wiring (a second wiring) to which the lower potential VSS is supplied. The transistor 214 is diode-connected. The reference voltage Vref5 is supplied to the inverted input terminal of the comparator 201, and the non-inverted input terminal of the comparator 201 is connected to a connection point between the transistors 213 and 214. The reference voltage Vref5 is also supplied to a gate of the transistor 213. The voltage Vout is extracted from a connection point between the transistor 202 and the transistor 213. Further, the transistors 213 and 214 have mutually the same transistor sizes.

In this case, the gate-source voltage Vgs of the transistor 213 becomes Vout-Vref5. As described above, because the transistor sizes of the transistors 213 and 214 are mutually equal, when the amounts of flowing current are equal, the gate-source voltages Vgs of the transistors must become equal to each other. Because the transistor 214 is diode-connected, a source-drain voltage of the transistor 214 is also given by Vout-Vref5.

As a result, a level of a connection point (a node c2) between the transistors 213 and 214, that is, a level of the detection signal Vdiff input to the non-inverted input terminal of the comparator 201 is given by $$\text{Vout}-\text{Vref5} \qquad (6)$$

As is clear from the equation (6), in the present modification, a variation of the voltage Vout is directly reflected, in the detection signal Vdiff. Therefore, the comparator 201 can perform the voltage determination with high sensitivity. As a result, the level of the voltage Vout generated by the internal-voltage-drop power-source generating circuit 210 can be stabilized more stably.

Figure 12:
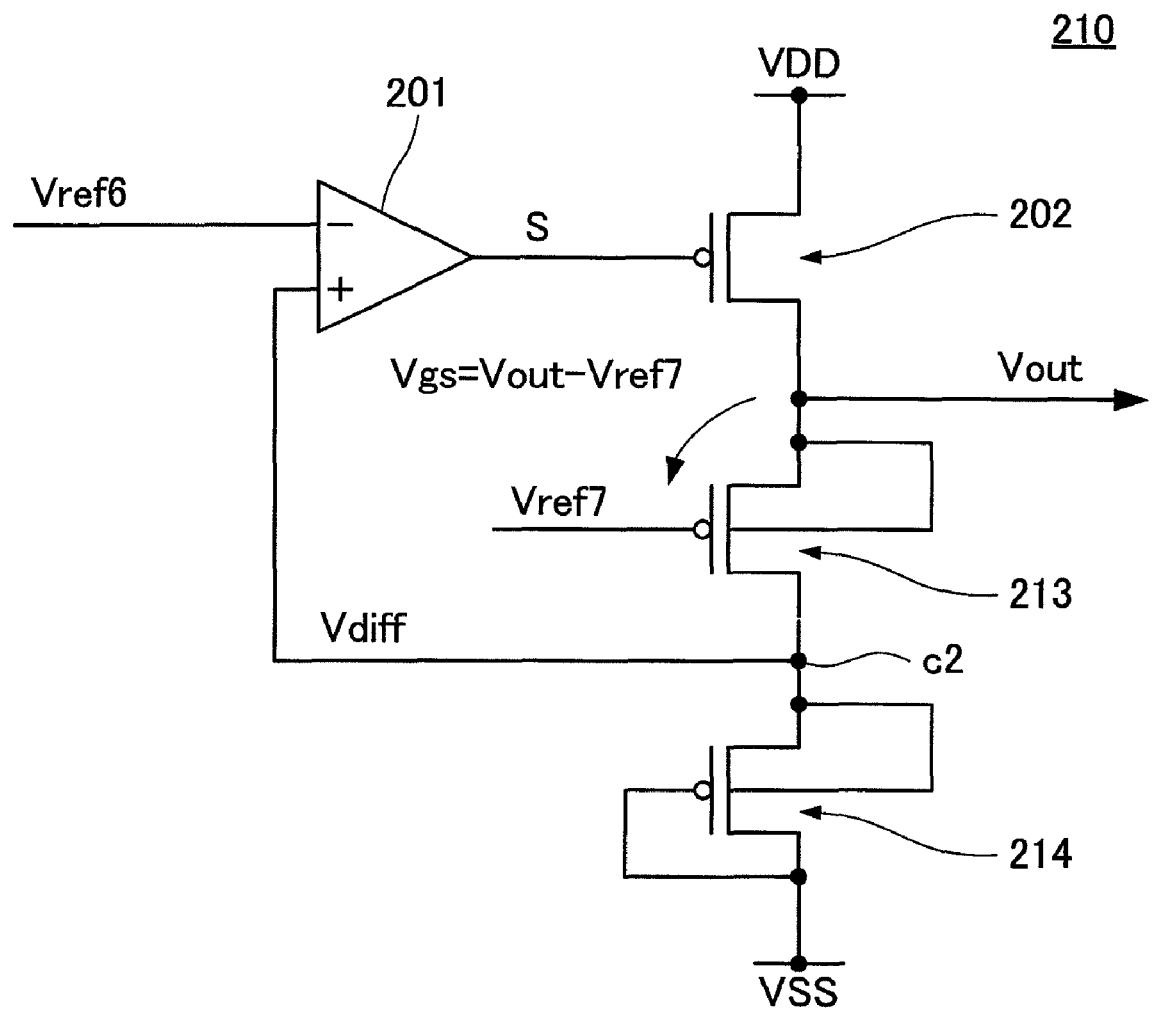
FIG. 12 is a circuit diagram of an internal-voltage-drop power-source generating circuit according to still another modification of the third embodiment.

In the internal-voltage-drop power-source generating circuit 210 shown in FIG. 11, while the same reference voltage Vref5 is supplied to the comparator 201 and the transistor 213, mutually different reference voltages can be also supplied to the comparator 201 and the transistor 213, as shown in FIG. 12.

In the example shown in FIG. 12, the reference voltage Vref6 is supplied to the comparator 201, and the reference voltage Vref7 is supplied to the transistor 213. In this case, the voltage Vout is adjusted to Vref6+Vref7. While a relationship between the reference voltages Vref6 and Vref7 is not particularly limited, preferably, Vref7 is set lower than Vref6. According to this, the gate-source voltage Vgs=Vref7 of the transistor 213 can be sufficiently secured, and the operation can be stabilized at a low voltage.

It is apparent that the present invention is not limited to the above embodiments, but may be modified and changed without departing from the scope and spirit of the invention.

What is claimed is:

1. A semiconductor device having a voltage detecting circuit detecting a voltage between first and second wirings, the voltage detecting circuit comprising at least first and second transistors connected in series between the first and second wirings, wherein
a first reference voltage is supplied to a gate of the first transistor, a gate and a drain of the second transistor are short-circuited, and a detection signal is output from a connection point between a drain of the first transistor and a source of the second transistor.

2. The semiconductor device as claimed in claim 1, wherein the first and second transistors are N-channel MOS transistors, a source of the first transistor is connected to the first wiring, and a potential applied to the first wiring is lower than a potential applied to the second wiring.

3. The semiconductor device as claimed in claim 1, wherein the first and second transistors are P-channel MOS transistors, a source of the first transistor is connected to the first wiring, and a potential applied to the first wiring is higher than a potential applied to the second wiring.

4. The semiconductor device as claimed in claim 1, wherein the first transistor and the second transistor have same sizes.

5. The semiconductor device as claimed in claim 1, wherein the voltage detecting circuit further comprises a third transistor connected between the second wiring and the second transistor, wherein a gate and a drain of the third transistor are short-circuited.

6. The semiconductor device as claimed in claim 1, wherein the voltage detecting circuit further comprises a comparator comparing the detection signal and a second reference voltage.

7. The semiconductor device as claimed in claim 6, wherein the voltage detecting circuit further comprises a third transistor connected between the first wiring and the first transistor or between the second wiring and the second transistor, wherein an output of the comparator is supplied to a gate of the third transistor.

8. The semiconductor device as claimed in claim 7, wherein the first and second transistors are N-channel MOS transistors, the third transistor is connected between the second wiring and the second transistor, and the first reference voltage is higher than the second reference voltage.

9. The semiconductor device as claimed in claim 7, wherein the first and second transistors are P-channel MOS transistors, the third transistor is connected between the first wiring and the first transistor, and the first reference voltage is lower than the second reference voltage.

10. A semiconductor device comprising:

first and second wirings;

an internal-voltage generating circuit generating a potential to be applied to the first or second wiring;

a voltage detecting circuit detecting a voltage between the first and second wirings so as to generate a detection signal, the voltage detecting circuit including at least first and second transistors connected in series between the first and second wirings, a first reference voltage is supplied to a gate of the first transistor, a gate and a drain of the second transistor are short-circuited, and the detection signal is output from a connection point between a drain of the first transistor and a source of the second transistor; and a comparator comparing the detection signal and the second reference voltage, wherein the internal-voltage generating circuit is controlled based on an output of the comparator.

* * * * *